United States Patent
Hacker et al.

(10) Patent No.: US 6,358,559 B1
(45) Date of Patent: Mar. 19, 2002

(54) DIELECTRIC FILMS FROM ORGANOHYDRIDOSILOXANE RESINS WITH LOW ORGANIC CONTENT

(75) Inventors: Nigel P. Hacker, Palo Alto; Scott P. Lefferts, Sunnyvale; Lisa K. Figge, Menlo Park; Michael D. Slessor, Campbell, all of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/609,437

(22) Filed: Jun. 30, 2000

Related U.S. Application Data

(62) Division of application No. 09/227,035, filed on Jan. 7, 1999, now Pat. No. 6,177,199.

(51) Int. Cl.$^7$ .............................. B05D 3/02; B05D 5/12
(52) U.S. Cl. .................... 427/58; 427/240; 427/379; 427/387
(58) Field of Search .................. 427/387, 58, 240, 427/379

(56) References Cited

U.S. PATENT DOCUMENTS

| | | | |
|---|---|---|---|
| 2,637,718 A | 5/1953 | Rust | 260/46.5 |
| 3,615,272 A | 10/1971 | Collins et al. | 423/325 |
| 4,026,868 A | 5/1977 | Merrill | 260/46.5 |
| 4,399,266 A | 8/1983 | Matsumura et al. | 528/10 |
| 4,609,751 A | 9/1986 | Hajjar | 556/456 |
| 4,624,870 A | 11/1986 | Anthony | 427/387 |
| 4,626,556 A | 12/1986 | Nozue et al. | 522/99 |
| 4,670,299 A | 6/1987 | Fukuyama et al. | 427/96 |
| 4,694,040 A | 9/1987 | Hashimoto et al. | 524/765 |
| 4,723,978 A | 2/1988 | Clodgo et al. | 65/31 |
| 4,749,631 A | 6/1988 | Haluska et al. | 428/704 |
| 4,753,855 A | 6/1988 | Haluska et al. | 428/702 |
| 4,756,977 A | 7/1988 | Haluska et al. | 428/704 |
| 4,808,653 A | 2/1989 | Haluska et al. | 524/398 |
| 4,822,697 A | 4/1989 | Haluska et al. | 428/698 |
| 4,847,162 A | 7/1989 | Haluska et al. | 428/457 |
| 4,849,296 A | 7/1989 | Haluska et al. | 428/457 |
| 4,895,914 A | 1/1990 | Saitoh et al. | 525/478 |
| 4,898,907 A | 2/1990 | Haluska et al. | 524/490 |
| 4,911,992 A | 3/1990 | Haluska et al. | 428/698 |
| 4,973,526 A | 11/1990 | Haluska | 428/697 |
| 4,999,397 A | 3/1991 | Weiss et al. | 524/755 |
| 5,008,320 A | 4/1991 | Haluska et al. | 524/361 |
| 5,010,159 A | 4/1991 | Bank et al. | 528/23 |
| 5,045,592 A | 9/1991 | Weiss et al. | 524/755 |
| 5,059,448 A | 10/1991 | Chandra et al. | 427/53.1 |
| 5,063,267 A | 11/1991 | Hanneman et al. | 524/284 |
| 5,085,893 A | 2/1992 | Weiss et al. | 427/387 |
| 5,091,162 A | 2/1992 | Frye et al. | 423/325 |
| 5,106,604 A | 4/1992 | Agaskar | 423/325 |
| 5,116,637 A | 5/1992 | Baney et al. | 427/340 |
| 5,118,530 A | 6/1992 | Hanneman et al. | 427/226 |
| 5,145,723 A | 9/1992 | Ballance et al. | 427/397.7 |
| 5,165,955 A | 11/1992 | Gentle | 427/575 |
| 5,183,684 A | 2/1993 | Carpenter | 427/574 |
| 5,210,168 A | 5/1993 | Bergstrom et al. | 528/12 |
| 5,238,787 A | 8/1993 | Haluska et al. | 430/325 |
| 5,258,334 A | 11/1993 | Lantz, II | 437/238 |
| 5,262,201 A | 11/1993 | Chandra et al. | 427/376.2 |
| 5,279,661 A | 1/1994 | Gentle | 106/287.1 |
| 5,283,545 A | 2/1994 | Pernisz | 338/308 |
| 5,290,354 A | 3/1994 | Haluska | 106/479 |
| 5,293,335 A | 3/1994 | Pernisz et al. | 365/148 |
| 5,310,583 A | 5/1994 | Eckstein et al. | 427/575 |
| 5,312,684 A | 5/1994 | Michael et al. | 428/336 |
| 5,320,868 A | 6/1994 | Ballance et al. | 427/228 |
| 5,336,532 A | 8/1994 | Haluska et al. | 427/515 |
| 5,348,839 A | 9/1994 | Haluska et al. | 430/270 |
| 5,370,903 A | 12/1994 | Mine et al. | 427/126.2 |
| 5,370,904 A | 12/1994 | Mine et al. | 427/126.2 |
| 5,372,842 A | 12/1994 | Mine et al. | 427/126.2 |
| 5,380,567 A | 1/1995 | Haluska | 427/578 |
| 5,416,190 A | 5/1995 | Mine et al. | 528/492 |
| 5,436,029 A | 7/1995 | Ballance et al. | 427/126.2 |
| 5,441,765 A | 8/1995 | Ballance et al. | 427/228 |
| 5,445,894 A | 8/1995 | Ballance et al. | 427/228 |
| 5,446,088 A | 8/1995 | Haluska | 524/588 |
| 5,486,564 A | 1/1996 | Mine et al. | 524/588 |
| 5,523,163 A | 6/1996 | Ballance et al. | 428/446 |
| 5,540,948 A | 7/1996 | Haluska | 427/96 |
| 5,547,703 A | 8/1996 | Camilletti et al. | 427/126.3 |
| 5,609,925 A | 3/1997 | Camilletti et al. | 427/503 |
| 5,618,878 A | 4/1997 | Syktich et al. | 524/588 |
| 5,635,240 A | 6/1997 | Haluska et al. | 427/180 |
| 5,670,596 A | 9/1997 | Razzano et al. | 528/16 |

(List continued on next page.)

FOREIGN PATENT DOCUMENTS

| | | |
|---|---|---|
| CA | 2100278 | 1/1994 |
| DE | 196 08 904 A1 | 9/1996 |
| EP | 0 270 229 A3 | 6/1988 |
| EP | 0 270 229 A2 | 6/1988 |

(List continued on next page.)

OTHER PUBLICATIONS

*Encyclopedia of Chemical Technology*, 4th Edition, John Wiley & Sons, Inc., 1995, vol. 14, p. 177.

Hacker, N., "Organic and Inorganic Spin–On Polymers for Low–Dielectic–Constant Applications," *MRS Bulletin*, vol. 22, No. 10, Oct. 1997, pp. 33–38.

*Primary Examiner*—Erma Cameron
(74) *Attorney, Agent, or Firm*—Fish & Associates, LLP; Robert D. Fish

(57) ABSTRACT

A method of making a dielectric film on a substrate from a composition containing an organohydridosiloxane resin is presented. The organohydridosiloxane resins have a cage conformation and up to 40 mole percent of an organic substituent. The process of making a dielectric film includes forming a solution of a solvent and the organohydridosiloxane resin, dispensing the solution on a substrate, spinning the substrate, baking the substrate to remove the solvent, and curing the substrate to form the dielectric film. The dielectric films of the present invention exhibit dielectric constants of approximately 3 or lower.

16 Claims, No Drawings

U.S. PATENT DOCUMENTS

| | | | |
|---|---|---|---|
| 5,707,681 A | 1/1998 | Bremmer et al. | 427/58 |
| 5,707,683 A | 1/1998 | Currie et al. | 427/126.2 |
| 5,840,821 A | 11/1998 | Nakane et al. | 528/10 |
| 5,853,808 A | 12/1998 | Arkles et al. | 427/377 |
| 5,858,544 A | 1/1999 | Banaszak Holl et al. | 428/447 |
| 5,859,162 A | 1/1999 | Yamamoto et al. | 528/31 |
| 5,859,168 A | 1/1999 | Yamamoto et al. | 528/31 |
| 6,043,330 A * | 3/2000 | Hacker et al. | 528/12 |
| 6,177,143 B1 * | 1/2001 | Treadwell et al. | 427/515 |

FOREIGN PATENT DOCUMENTS

| | | |
|---|---|---|
| EP | 0 270 231 A2 | 6/1988 |
| EP | 0 270 231 A3 | 6/1988 |
| EP | 0 270 263 A2 | 6/1988 |
| EP | 0 270 369 A3 | 6/1988 |
| EP | 0 270 369 A2 | 6/1988 |
| EP | 0 323 103 A2 | 7/1989 |
| EP | 0 323 186 A2 | 7/1989 |
| EP | 0 410 564 A3 | 1/1991 |
| EP | 0 410 564 A2 | 1/1991 |
| EP | 0 419 076 A1 | 3/1991 |
| EP | 0 427 395 A1 | 5/1991 |
| EP | 0 461 782 A3 | 12/1991 |
| EP | 0 461 782 A2 | 12/1991 |
| EP | 0 462 715 A1 | 12/1991 |
| EP | 0 466 205 A1 | 1/1992 |
| EP | 0 493 879 A2 | 7/1992 |
| EP | 0 493 879 A3 | 7/1992 |
| EP | 0 510 872 A1 | 10/1992 |
| EP | 0 512 717 A2 | 11/1992 |
| EP | 0 512 717 A3 | 11/1992 |
| EP | 0 516 144 A1 | 12/1992 |
| EP | 0 516 308 A1 | 12/1992 |
| EP | 0 560 485 A1 | 9/1993 |
| EP | 0 576 166 A2 | 12/1993 |
| EP | 0 596 678 A2 | 5/1994 |
| EP | 0 599 209 A3 | 6/1994 |
| EP | 0 599 209 A2 | 6/1994 |
| EP | 0 604 779 A1 | 7/1994 |
| EP | 0 606 580 A1 | 7/1994 |
| EP | 0 606 588 A1 | 7/1994 |
| EP | 0 615 000 A1 | 9/1994 |
| EP | 0 616 001 A1 | 9/1994 |
| EP | 0 652 246 A1 | 5/1995 |
| EP | 0 686 680 A1 | 12/1995 |
| EP | 0 725 103 A2 | 8/1996 |
| EP | 0 725 103 A3 | 8/1996 |
| EP | 0 727 817 | 8/1996 |
| EP | 0 750 337 | 12/1996 |
| EP | 0 270 263 A3 | 6/1998 |
| GB | 2 199 817 A | 7/1988 |
| JP | 52-31854 | 8/1977 |
| JP | 53-88099 | 8/1978 |
| JP | 55-111148 | 8/1980 |
| JP | 56-139533 | 10/1981 |
| JP | 57-112047 | 7/1982 |
| JP | 58-003249 | 1/1983 |
| JP | 58-066335 | 4/1983 |
| JP | 59-109565 | 6/1984 |
| JP | 59-189126 | 10/1984 |
| JP | 59-190211 | 10/1984 |
| JP | 60-42426 | 3/1985 |
| JP | 60-86017 | 5/1985 |
| JP | 60-124943 | 7/1985 |
| JP | 61-029153 | 2/1986 |
| JP | 61-127732 | 6/1986 |
| JP | 61-292342 | 12/1986 |
| JP | 2-277255 | 11/1990 |
| JP | 3-6845 | 1/1991 |
| JP | 3-227321 | 10/1991 |
| JP | 4-252228 | 9/1992 |
| JP | 4-252229 | 9/1992 |
| WO | WO 97/10282 | 3/1997 |
| WO | WO 98/47944 | 10/1998 |
| WO | 98-47945 * | 10/1998 |

* cited by examiner

DIELECTRIC FILMS FROM ORGANOHYDRIDOSILOXANE RESINS WITH LOW ORGANIC CONTENT

RELATED APPLICATION

This application is a division of U.S. application Ser. No. 09/227,035, filed Jan. 7, 1999 now U.S. Pat. No. 6,177,199 B1.

BACKGROUND

1. Field of the Invention

The present invention relates generally to dielectric films formed from siloxane based resins and methods of manufacturing those films, and more specifically to low dielectric constant films formed from low organic content organohydridosiloxane compositions and methods of manufacture thereof.

2. Related Art

Semiconductor devices often have one or more arrays of patterned interconnect levels that serve to electrically couple the individual circuit elements thus forming an integrated circuit (IC). These interconnect levels are typically separated by an insulating or dielectric film. Previously, a silicon oxide film formed using chemical vapor deposition (CVD) or plasma enhanced CVD (PECVD) techniques was the most commonly used material for such dielectric films. However, as the size of circuit elements and the spaces between such elements decreases, the relatively high dielectric constant of such silicon oxide films is problematic.

In order to provide a lower dielectric constant than that of silicon oxide, dielectric films formed from siloxane based resins are becoming widely used. One such family of films formed from siloxane based resins are the films derived from hydrogen silsesquioxane (HSQ) resins (See, U.S. Pat. No. 3,615,272, Oct. 19, 1971, Collins et al.; and U.S. Pat. No. 4,756,977, Jul. 12, 1988, Haluska et al.) However, while such films do provide lower dielectric constants than CVD or PECVD silicon oxide films and also provide other benefits such as enhanced gap filling and surface planarization, it has been found that typically the dielectric constants of such films are limited to approximately 3.0 or greater (See, U.S. Pat. No. 5,523,163, Jun. 4, 1996, Ballance et al.).

Since, as known, the dielectric constant of such insulating films is an important factor where IC's with low power consumption, cross-talk, and signal delay are required, forming an insulating film with a dielectric constant below 3.0 is desirable. As siloxane based resin materials have beneficial gap filling and planarization properties, forming such films from siloxane based resin materials is very desirable. In addition, it would be desirable to have low dielectric constant films formed from siloxane based resin materials which have a high resistance to cracking. Additionally, it would be desirable to manufacture low dielectric constant films from siloxane based resins via standard processing techniques. In this manner curing processes that require an ammonia or ammonia derivative type of atmosphere (See, U.S. Pat. No. 5,145,723, Sep. 8, 1992, Ballance et al.), an ozone atmosphere (See, U.S. Pat. No. 5,336,532, Haluska et al.), or other non-standard type of semiconductor process, are avoided.

SUMMARY

In accordance with the present invention, methods of using solutions of organohydridosiloxane resins of low organic content to manufacture low dielectric constant insulating films are provided.

The solutions from which the dielectric films in accordance with the present invention are formed, contain organohydridosiloxane resins having one of the four general formulae:

| | |
|---|---|
| $(HSiO_{1.5})_n(RSiO_{1.5})_m$ | Formula 1 |
| $(H_{0.4-1.0}SiO_{1.5-1.8})_n(R_{0.4-1.0}SiO_{1.5-1.8})_m$ | Formula 2 |
| $(H_{0-1.0}SiO_{1.5-2.0})_n(RSiO_{1.5})_m$ | Formula 3 |
| $(HSiO_{1.5})_x(RSiO_{1.5})_y(SiO_2)_z$ | Formula 4 | wherein:

the sum of n and m is from about 8 to about 5000, and m is selected such that the organic substituent is present to between about 0.1 and about 40 Mole percent (Mol %); the sum of x, y and z is from about 8 to about 5000 and y is selected such that the organic substituent is present to between about 0.1 and about 40 Mol %; and R is selected from substituted and unsubstituted groups including normal and branched alkyl groups, cycloalkyl groups, aryl groups, and mixtures thereof; and wherein the specific Mol % of organic or carbon containing substituents is a function of the ratio of the amounts of starting materials.

Embodiments of the present invention employ solutions containing organohydridosiloxane resins having a caged structure. These organohydridosiloxane resins have a polymer backbone encompassing alternate silicon and oxygen atoms. In particular, each backbone silicon atom is bonded to at least three backbone oxygen atoms.

In contrast with previously known organosiloxane resins, polymers of the present invention have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formulae 1, 2, 3 and 4. By attaching only hydrogen and/or R groups directly to backbone silicon atoms in the polymer, unwanted chain lengthening and cross-linking is avoided.

Some embodiments in accordance with the present invention employ spin coating techniques for application of solutions of the organohydridosiloxane resins. Typically, such resin solutions are approximately 5% to 35% (by weight) resin in an appropriate solvent.

In certain embodiments of the present invention, dielectric films formed from organohydridosiloxane resin solutions by spin coating methods are provided. Such dielectric films advantageously have low dielectric constants, of approximately 3.0 or lower.

DETAILED DESCRIPTION

As the present invention is described with reference to various embodiments thereof, it will be understood that these embodiments are presented as examples and not limitations of this invention. Thus, various modifications or adaptations of the specific materials and methods may become apparent to those skilled in the art. All such modifications, adaptations or variations that rely upon the teachings of the present invention as illustrated by the embodiments herein, are considered to be within the spirit and scope of the present invention.

Methods of forming dielectric films from solutions containing organohydridosiloxane resins are provided according to embodiments of the present invention. The solutions contain organohydridosiloxane resins having one of the four general formulae:

$$(HSiO_{1.5})_n(RSiO_{1.5})_m \quad \text{Formula 1}$$

$$(H_{0.4-1.0}SiO_{1.5-1.8})_n(R_{0.4-1.0}SiO_{1.5-1.8})_m \quad \text{Formula 2}$$

$$(H_{0-1.0}SiO_{1.5-2.0})_n(RSiO_{1.5})_m \quad \text{Formula 3}$$

$$(HSiO_{1.5})_x(RSiO_{1.5})_y(SiO_2)_z \quad \text{Formula 4}$$

wherein:

the sum of n and m is from about 8 to about 5000 and m is selected such that the organic substituent is present to between about 0.1 and about 40 Mole percent (Mol %); the sum of x, y and z is from about 8 to about 5000 and y is selected such that the organic substituent is present to between about 0.1 and about 40 Mol %; and R is selected from substituted and unsubstituted groups including normal and branched alkyl groups, cycloalkyl groups, aryl groups, and mixtures thereof; and wherein the specific Mol % of organic or carbon containing substituents is a function of the ratio of the amounts of starting materials. In some embodiments, particularly favorable results are obtained with the mole percent of organic substituents being in the range of between about 5 Mol % to about 25 Mol %. For substituent R a methyl group, this range corresponds to a carbon content of the organohydridosiloxane resin of between about 1% and about 6% by weight.

The organohydridosiloxane resins used in making dielectric films, according to embodiments of the present invention, can have molecular weights between about 400 and 200,000 atomic mass units. All molecular weights are reported as weight average molecular weights. Preferably the resins have molecular weights between about 1000 and 100,000 atomic mass units and most preferably between about 10,000 and 60,000 atomic mass units.

The organohydridosiloxane resins used in making the dielectric films are further described in U.S. patent application Ser. No. 09/044,831, entitled "ORGANOHYDRIDOSILOXANE RESINS WITH LOW ORGANIC CONTENT", which is commonly assigned with the present application and is incorporated herein by reference Methods of the present invention typically employ spin coating techniques for application of films containing organohydridosiloxane resins. As one of ordinary skill in the art knows, semiconductor substrates are currently available in a variety of sizes ranging from as small as three or four inches in diameter to as large as twelve inches in diameter. Therefore, it will be understood that the process parameters presented hereinafter are for a four inch or six inch wafer and are for illustrative purposes only. Thus, modifications to the volume of material, solution concentration, rotational speeds or the various times described below are appropriate for any specific application. It will be further understood, therefore, that all such modification are within the scope and spirit of the present invention.

A solution of organohydridosiloxane resin is prepared by combining the resin with an appropriate solvent. Typically, such resin solutions are approximately 5% to 35% (by weight) resin. Advantageously, methyl isobutyl ketone (MIBK), heptane, dodecane, butyl ether, butyl acetate, isobutyl acetate, propyl acetate or a blend of hexamethyldisiloxane, octamethyltrisiloxane, and octamethylcyclotetrasiloxane, or combinations thereof are useful as solvents, although other appropriate solvents may also be employed. Prior to use, the solvents are preferably dried over 3 Å or 4 Å molecular sieves.

The resulting solution is then filtered under ambient conditions via any of the filtration devices well known in the art. It is generally preferable to use a filtration device having a pore size less than about 1 μm. A typical filtration process uses a pore size of about 0.1 μm.

In the spin coating process, the organohydridosiloxane resin solution prepared in the manner described above is dispensed onto a wafer at or near its center. In some embodiments, the wafer will remain stationary during the dispense cycle, while in some embodiments, the wafer will turn or spin at a relatively low speed, typically less than about 500 revolutions per minute (rpm). The dispense cycle is followed by a short rest period and then additional spins, hereinafter referred to as thickness spins, generally between approximately 2000 and 3000 rpm, although other spin speeds may be used, as appropriate.

Once the coating process, as described above, is completed, the coated substrate, that is the substrate coated with the resin solution, is heated to effect a bake process and a subsequent cure process. The bake process removes the solvent from the resin solution on the substrate, causes the polymer to flow, and begins the conversion of the coating to the dielectric film. The cure process completes the conversion of the coating to the dielectric film. Any conventional apparatus known in the art can be employed for these processes.

Preferably, the apparatus for the bake process is an integral part of a spin coating apparatus used for coating the substrate or wafer, although a separate apparatus for curing coatings applied in accordance with embodiments of the present invention is also suitable. The bake process can be carried out in an inert atmosphere such as an atmosphere of an inert gas, nitrogen, or nitrogen/air mixture. One commonly employed heating apparatus employs one or more "hot plates" to heat the coated wafer from below. The coated wafer is typically heated for up to about 120 sec at each of several hot plates at successively higher temperatures. Typically, the hot plates are at temperatures between about 70° C. and 350° C. One typical process employs a heating apparatus having three hot plates. First, the wafer is baked for about 60 sec at 150° C. Then the wafer is transferred to a second hot plate for an approximately 60 sec bake period at 200° C. Finally, the wafer is transferred to a third hot plate for a third bake period of approximately 60 sec at 350° C.

A final cure process is preferably employed to complete the curing of the film. The cure is preferably performed in an inert atmosphere, as described above for the bake process. This final cure process can employ a conventional thermal curing apparatus, for example a horizontal furnace with a temperature range of about 300° C. to about 450° C. and preferably from about 375° C. to about 425° C. In a typical cure process, the baked wafer is cured for 30 minutes to one hour at 400° C. at a nitrogen flow rate of 4 liters/min to 20 liters/min.

Alternatively, the cure process can employ a high-temperature hot plate curing module which has an oxygen-density-controlled environment. In this process, the baked wafer is cured on a hot plate at a temperature between about 400° C. and 450° C. for a period of from about 1 to about 15 minutes in a nitrogen or inert atmosphere with an oxygen density of less than about 100 parts per million. For example, a suitable cure atmosphere is achieved with a nitrogen flow rate of between about 10 and about 30 liters/min.

It will be understood that the above bake and cure processes were described for illustrative purposes only and that other temperatures, durations, and number of bake cycles can be employed, where appropriate.

The thickness of the resulting dielectric film on a substrate depends on a number of variables. The variables include, organic content of the organohydridosiloxane resin, type of substituent in the resin, solvent properties, resin molecular weight, percentage of the resin solids in the resin solution, the amount of resin solution dispensed onto the substrate, and the speed of the thickness spin. The higher the percentage of resin solids in the solution, the thicker the resulting dielectric film. Conversely, the higher the speed of the thickness spin, the thinner the resulting dielectric film. In addition, the thickness of the dielectric film can depend on the nature and amount of the organic constituents in the organohydridosiloxane resin.

According to embodiments of the present invention, dispensing 2 ml of resin solution that is between about 5% and about 35% resin by weight on a 4 inch wafer, using a thickness spin between about 2000 and about 3000 rpm, results in dielectric films ranging from about 1000 Å to about 9000 Å in thickness. Variation in thickness, determined by independent measurements on a single wafer, ranges from about 0.8% to 6% and preferably the variation in thickness is less than 1%.

In certain embodiments of the present invention, dielectric films formed from organohydridosiloxane resin solutions by spin coating methods are provided. The dielectric films are formed from solutions of organohydridosiloxane resins having a mole percent of organic substituents preferably in the range between about 5 Mol % and about 25 Mol %. As demonstrated in the examples below, such dielectric films advantageously exhibit low dielectric constants, typically approximately 3.0 or lower. In addition, they exhibit adhesion to semiconductor substrates of greater than about 8 kpsi.

The following characteristics encompass non-limiting measurements that illustrate the properties of films of organohydridosiloxane polymer resins of the present invention. The methods of measurement used are as follows:

1) Film Thickness (Å):

Film thickness is measured using a calibrated Nanospec® AFT-Y CTS-102 model 010-180 Film Thickness Measurement System available from Nanometrics, Co. An average of measurements at five locations on a wafer are reported as the film thickness for each sample. Thickness measurements are corrected for the refractive index as measured on a Rudolph ellipsometer.

2) Refractive Index:

Refractive index is measured on a Rudolph Research AutoEL ellipsometer using a wavelength of 633.3 nm.

3) Dielectric Constant:

Dielectric constant is determined using the capacitance-voltage ("CV") measurement technique and employs a Hewlett-Packard Model 4061A semiconductor measurement system at a frequency of 1 MHz. This test procedure employs a metal-insulator-metal (MIM) structure with the thickness of each layer ranging from about 0.5 to 1 micron ($\mu$m).

4) Solution Viscosity (cP):

A Brookfield Synchro-lectric Viscometer, Model LVT 62238 is employed to measure the viscosity of organohydridosiloxane resin solutions at ambient temperature.

5) Adhesion to Surfaces:

The wafer is coated using appropriate spin, bake, and cure cycles. Studs, kept refrigerated until just before use are glued to the center of at least 15 to 25 samples per wafer made by cleaving the wafer into 2.25 cm$^2$ samples. The studs samples with a small vice/clip device (the tool and method are self-explanatory), and the samples are then baked at 150° C. for 60 minutes to cure the epoxy and then cooled to ambient temperature.

A Sebastian-5A stud-pull instrument manufactured by The Quad Group, Spokane, Wash., is used to measure the adhesion strength of the polymer film. The tail of the stud is inserted into a receiving cavity in the instrument and automatically pulled upon a until the system senses a break. The value recorded is expressed in kpsi (thousand pounds per square inch).

EXAMPLE 1

Methyl isobutyl ketone (MIBK) (2000.1 g) was dried over 4 Å molecular sieves and combined with 501.1 g of 20 mol % methylhydridosiloxane resin, which contains approximately 4% to 5% carbon, as measured by Rutherford back scattering, to form a solution. The solution was filtered to 0.1 $\mu$m. The solution was coated on six bare silicon wafers using a conventional spin coater. After a 3 second delay, the wafers were spun at speeds ranging from 1000 to 6000 rpm for 20 seconds. Acceleration before the thickness spin and deceleration afterwards were both at a rate of 50,000 rpm/sec. The wafers were baked on three successive hot plates for one minute each at 150° C., 200° C., and 350° C., respectively. The wafers were cured at 400° C. for 45 minutes in a horizontal furnace under a nitrogen atmosphere at a flow rate of 14 liters/min. Film thickness as a function of spin speed, determined after the bake step and determined again after the cure step, corrected for refractive index, is given below in Table 1.

TABLE 1

THICKNESS OF FILMS FROM SOLUTIONS OF METHYLHYDRIDOSILOXANE RESIN CONTAINING 4–5% CARBON

| Speed (RPM) | Baked Thickness (Å) | Baked Non-Uniformity | Cured Thickness (Å) | Cured Non-Uniformity |
|---|---|---|---|---|
| 1000 | 6936 | 1.0% | 7248 | 0.9% |
| 2000 | 4794 | 0.4% | 5061 | 0.4% |
| 3000 | 3927 | 0.08% | 4132 | 0.4% |
| 4000 | 3426 | 0.4% | 3616 | 0.7% |
| 5000 | 3048 | 0.3% | 3208 | 0.5% |
| 6000 | 2735 | 0.2% | 2888 | 0.8% |

EXAMPLE 2

Methyl isobutyl ketone (MIBK) (30.5 g) was dried over 4 Å molecular sieves and combined with 10.5 g of 20 mol % ethylhydridosiloxane resin, which contains approximately 4% to 5% carbon to form a solution. The solution was filtered to 0.2 $\mu$m. The solution was coated on a bare silicon wafer using a spin coater. After a 3 second delay, the wafers were spun at 3000 rpm for 20 seconds. Acceleration before the thickness spin and deceleration afterwards were both at a rate of 50,000 rpm/sec. The wafer was baked on three successive hot plates for one minute each at 150° C., 200° C., and 350° C., respectively. Film thickness on the wafer averaged 5907 Å, corrected for the refractive index of 1.4. Thickness varied by 0.5% over 5 measurements. The wafer was cured at 400° C. for 30 minutes in a horizontal furnace under a nitrogen atmosphere at a flow rate of 14 liters/min. Thickness after curing averaged 6178 Å, corrected for the refractive index of 1.366. Thickness varied by 0.4% over 5 measurements.

EXAMPLE 3

Viscosity of the solutions of Examples 1 and 2, is given below in Table 2.

TABLE 2

VISCOSITY OF SOLUTIONS OF METHYLHYDRIDOSILOXANE RESIN CONTAINING 4–5% CARBON

| Example | % solids | Viscosity (cP) |
|---|---|---|
| Example 1 | 20.0 | 1.26 |
| Example 2 | 25.7 | 1.80 |

EXAMPLE 4

Polymer solutions were prepared according to the methods of Example 1, using the percentages of methyl substituent in the methylhydridosiloxane resin listed in Table 3, below. Films were prepared by spinning the polymer solutions onto 6 inch silicon wafers with a 6000 Å film of silane oxide deposited on the surface. The spin, bake and cure conditions used were identical to those described in Example 2. Each wafer was cleaved into 15 samples and the adhesion to each sample was measured by the stud pull test in the manner previously described. The values reported are the average of 15 samples tested for each film. In most cases, the adhesion failure occurs at the stud/epoxy interface, which suggests the adhesion at the film/substrate interface is greater than the values reported below.

TABLE 3

STUD PULL VALUES FOR FILMS WITH DIFFERENT PERCENT METHYL SUBSTITUENTS

| Mol % Methyl | Stud pull value (kpsi) |
|---|---|
| 0 | 9.5 |
| 5 | 9.2 |
| 10 | 8.6 |
| 15 | 8.8 |
| 20 | 9.6 |

EXAMPLE 5

Methyl isobutyl ketone (MIBK) (63.8g) was dried over 4 Å molecular sieves and combined with 14.0 g of 20 mol % methylhydridosiloxane resin, which contains approximately 4% to 5% carbon to form a solution. The solution was filtered to 0.2 μm. The solution was coated on two bare silicon wafers using a spin coater. After a 3 second delay, the wafers were spun at 2000 rpm for 20 seconds. Acceleration before the thickness spin and deceleration afterwards were both at a rate of 50,000 rpm/sec. The wafer were baked on three successive hot plates for one minute each at 150° C., 180° C., and 300° C., respectively. Film thickness on the two wafers averaged 4550 Å, corrected for the refractive index of 1.403. Thickness varied by <0.7% over 5 measurements on each of two wafers. The wafers were cured at 400° C. for one hour in an horizontal furnace under a nitrogen atmosphere at a flow rate of 4 liters/min. Thickness after curing averaged 4688 Å, corrected for the refractive index of 1.366. Thickness varied by <1.4% over 5 measurements on each of the two wafers. The dielectric constant of the film after curing was 3.04.

EXAMPLES 6 THROUGH 10

Examples 6 through 10 describe the process of making dielectric films from organohydridosiloxane resins of different organic substituents. The same process of forming a solution, filtering, dispensing, spinning, baking, and curing, as described in Example 5 above was used. One bare silicon wafer was coated in each of Examples 6 through 10. Reported thickness values are the average of five measurements on a single wafer. Results are summarized in Tables 4 and 5, below.

TABLE 4

SOLUTIONS OF ORGANOHYDRIDOSILOXANE RESINS

| Example | Mol % organic substituent | % carbon | resin (g) | solvent (g) | weight % resin |
|---|---|---|---|---|---|
| Example 5 | 20% methyl | 4–5 | 14.0 | MIBK 63.8 | 18.0 |
| Example 6 | 20% ethyl | 5–8 | 14.0 | MIBK 63.7 | 18.0 |
| Example 7 | 26% propyl | 8–12 | 26.8 | MIBK 120.2 | 18.2 |
| Example 8 | 20% n-butyl | 10–14 | 13.97 | MIBK 64.2 | 17.9 |
| Example 9 | 20% cyclohexyl | 15–20 | 14.5 | Siloxane* 66.0 | 18.0 |
| Example 10 | 20% phenyl | 15–20 | 9.0 | MIBK 41.2 | 17.9 |

*Blend of hexamethyldisiloxane, octamethyltrisiloxane, and octamethylcyclotetrasiloxane

TABLE 5

PROPERTIES OF DIELECTRIC FILMS

| Example | Thickness before cure (Å) | Variation (%) | Thickness after cure (Å) | Variation (%) | Dielectric Constant |
|---|---|---|---|---|---|
| Example 5 | 4550 | 0.93 | 4688 | 1.8 | 3.04 |
| Example 6 | 4775 | 0.90 | 4965 | 2.5 | 2.97 |
| Example 7 | 3350 | 1.2 | 3063 | | 2.86 |
| Example 8 | 4416 | 0.37 | 4144 | 1.4 | 2.86 |
| Example 9 | 4337 | 3.1 | 4171 | 5.3 | 3.03 |
| Example 10 | 4786 | 0.58 | 5054 | 0.51 | 2.82 |

As it can be seen, dielectric constants for all examples were approximately 3 or lower. These values may be compared with the dielectric constant of a film of a previously known hydridosiloxane resin with no organic substituents, prepared in exactly the same way as Examples 5 through 10 above, which exhibits a dielectric constant of 3.27. In view of the foregoing, it will be understood that the present invention provides methods of preparing dielectric films of organohydridosiloxane resins containing up to 40 mole percent of organic substituents. It will be understood these methods of preparing dielectric films employ standard processing techniques of semiconductor fabrication, avoiding use of ammonia, ozone, or other non-standard atmospheres. Further, it will be understood that the present invention additionally includes the dielectric films so produced. These films are advantageously used in semiconductor devices as insulating materials with low dielectric constants.

We claim:

1. A method of making a dielectric film on a substrate comprising:

forming a solution of a solvent and an organohydridosiloxane resin comprising a polymer having a general formula:

$(H_{0.4-1.0}SiO_{1.5-1.8})_n(R_{0.4-1.0}SiO_{1.5-1.8})_m$, or $(H_{0-1.0}SiO_{1.5-2.0})_n(RSiO_{1.5})_m$, wherein the organohydridosiloxane resin comprises an organic substituent;

wherein the sum of n and m is from about 8 to about 5000, m is selected such that the organic substituent is present in an amount of between about 0.1 and about 40 Mole percent (Mol %) or greater, R is selected from normal and branched alkyl groups, cycloalkyl groups, aryl groups, and mixtures thereof, wherein the polymer has essentially no hydroxyl or alkoxy groups bonded to silicon atoms;

dispensing the solution on the substrate;

spinning the substrate to form an organohydridosiloxane resin coated substrate;

baking the organohydridosiloxane resin coated substrate; and curing the organohydridosiloxane resin coated substrate, wherein said dielectric film is formed.

2. The method of claim 1 wherein baking the coated substrate removes any residual solvent, causes said polymer to flow, and partially converts said resin to said dielectric film.

3. The method of claim 1 wherein baking the coated substrate comprises heating the organohydridosiloxane resin coated substrate at a first bake temperature for a first bake time period.

4. The method of claim 3 wherein baking the coated substrate further comprises heating the organohydridosiloxane resin coated substrate to a second bake temperature for a second bake time period, said second bake temperature being equal to or higher than said first bake temperature.

5. The method of claim 4 wherein baking the coated substrate further comprises heating the organohydridosiloxane resin coated substrate to a third bake temperature for a third bake time period, said third bake temperature being equal to or higher than said second bake temperature.

6. The method of claim 1 wherein curing the coated substrate comprises heating the organohydridosiloxane resin coated substrate on a hot plate to a cure temperature for a cure time period in an oxygen-density-controlled atmosphere.

7. The method of claim 6 wherein the cure temperature is at least about 400° C.; the cure time period is less than or equal to about 15 minutes and the atmosphere is controlled such that the oxygen density is less than about 100 parts per million.

8. The method of claim 1 wherein the solvent is selected from the group consisting of methyl isobutyl ketone, heptane, dodecane, butyl ether, butyl acetate, isobutyl acetate, propyl acetate, hexamethyldisiloxane, octamethyltrisiloxane, octamethylcyclotetrasiloxane, and combinations thereof.

9. The method of claim 8 wherein the solvent is dried over molecular sieves with characteristic dimension between about 3 and about 4 Å.

10. The method of claim 1 wherein forming a solution of a solvent and an organohydridosiloxane resin is forming a solution of a solvent and an organohydridosiloxane resin having a cage conformation.

11. The method of claim 1 wherein forming a solution of a solvent and an organohydridosiloxane resin is forming a solution of a solvent and an organohydridosiloxane resin having a weight average molecular weight of between about 400 and about 200,000 atomic mass units.

12. The method of claim 11 wherein forming a solution of a solvent and an organohydridosiloxane resin is forming a solution of a solvent and an organohydridosiloxane resin having a weight average molecular weight of between about 5,000 and about 60,000 atomic mass units.

13. The method of claim 12 wherein forming a solution of a solvent and an organohydridosiloxane resin is forming a solution of a solvent and an organohydridosiloxane resin having a weight average molecular weight of between about 20,000 and about 40,000 atomic mass units.

14. The method of claim 1 wherein forming a solution of a solvent and an organohydridosiloxane resin is forming a solution of a solvent and an organohydridosiloxane resin comprising R selected from the group consisting of methyl, ethyl, propyl, butyl, t-butyl, pentyl, hexyl, cyclohexyl, phenyl, benzyl, chloromethyl, and mixtures thereof.

15. A method of making a dielectric film on a substrate comprising:

forming a solution of a solvent and an organohydridosiloxane resin comprising a polymer having a general formula:

$(HSiO_{1.5})_n(RSiO_{1.5})_m$, or $(H_{0.4-1.0}SiO_{1.5-1.8})_n(R_{0.4-1.0}SiO_{1.5-1.8})_m$, or $(H_{0-1.0}SiO_{1.5-2.0})_n(RSiO_{1.5})_m$, or $(HSiO_{1.5})_x(RSiO_{1.5})_y(SiO_2)_z$, wherein the organohydridosiloxane resin comprises an organic substituent;

wherein the sum of n and m is from about 8 to about 5000, m is selected such that the organic substituent is present in an amount of between about 0.1 and about 40 Mole percent (Mol %) or greater, the sum of x, y and z is from about 8 to 5000, y is selected such that the organic substituent is present in an amount of between about 0.1 and about 40 Mol % or greater, and R, in any general formula, is selected from normal and branched alkyl groups, cycloalkyl groups, aryl groups, and mixtures thereof;

dispensing the solution on the substrate;

spinning the substrate to form an organohydridosiloxane resin coated substrate;

baking the organohydridosiloxane resin coated substrate to remove any residual solvent, cause said polymer to flow, and partially convert said resin to said dielectric film; and curing the organohydridosiloxane resin coated substrate on a hot plate to a cure temperature for a cure time period in an oxygen-density-controlled atmosphere, wherein said conversion to said dielectric film is completed.

16. The method of claim 15 wherein the cure temperature is at least about 400° C.; the cure time period is less than or equal to about 15 minutes and the atmosphere is controlled such that the oxygen density is less than about 100 parts per million.

* * * * *